(12) United States Patent
Xiu et al.

(10) Patent No.: US 9,269,596 B2
(45) Date of Patent: Feb. 23, 2016

(54) NARROW-GAP FLIP CHIP UNDERFILL COMPOSITION

(71) Applicant: Intel Corporation, Santa Clara, CA (US)

(72) Inventors: Yonghao Xiu, Chandler, AZ (US); Nisha Ananthakrishnan, Chandler, AZ (US); Yiqun Bai, Chandler, AZ (US); Arjun Krishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 14/135,236

(22) Filed: Dec. 19, 2013

(65) Prior Publication Data

US 2015/0179478 A1 Jun. 25, 2015

(51) Int. Cl.
*H01L 23/29* (2006.01)
*H01L 21/56* (2006.01)
*H01L 23/00* (2006.01)

(52) U.S. Cl.
CPC ............ *H01L 21/563* (2013.01); *H01L 23/295* (2013.01); *H01L 24/17* (2013.01); *H01L 24/81* (2013.01); *H01L 2224/16057* (2013.01); *H01L 2224/16225* (2013.01); *H01L 2224/81801* (2013.01); *H01L 2924/01006* (2013.01); *H01L 2924/0493* (2013.01); *H01L 2924/04642* (2013.01); *H01L 2924/053* (2013.01); *H01L 2924/0533* (2013.01); *H01L 2924/05341* (2013.01); *H01L 2924/05432* (2013.01); *H01L 2924/05442* (2013.01); *H01L 2924/186* (2013.01)

(58) Field of Classification Search
CPC ....... H01L 21/563; H01L 24/17; H01L 24/81; H01L 23/295
USPC ......................................... 257/795
See application file for complete search history.

(56) References Cited

U.S. PATENT DOCUMENTS 9,023,249 B2 * 5/2015 Fathi et al. ................. 252/501.1
2009/0062449 A1 * 3/2009 Wang ........................... 524/430

* cited by examiner

*Primary Examiner* — Luan C Thai
(74) *Attorney, Agent, or Firm* — Schwegman Lundberg & Woessner, P.A.

(57) ABSTRACT

An underfill composition comprises a curable resin, a plurality of filler particles loaded within the resin, the filler particles comprising at least 50 weight % of the underfill composition. The filler particles comprise first filler particles having a particle size of from 0.1 micrometers to 15 micrometers and second filler particles having a particle size of less than 100 nanometers. A viscosity of the underfill composition is less than a viscosity of a corresponding composition not including the second filler particles.

20 Claims, 8 Drawing Sheets

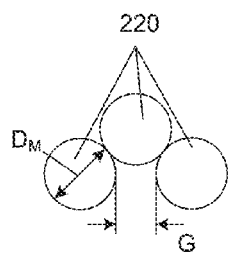
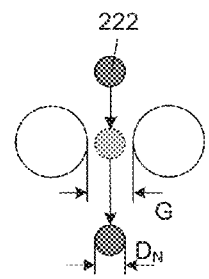
FIG. 4A    FIG. 4B
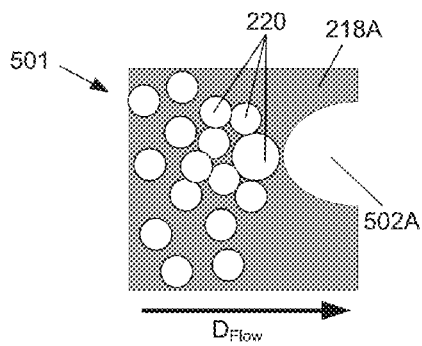
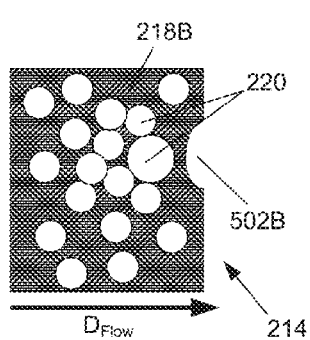
FIG. 5A    FIG. 5B
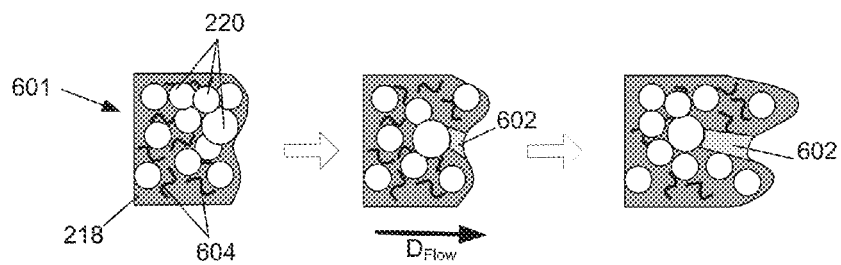
FIG. 6A
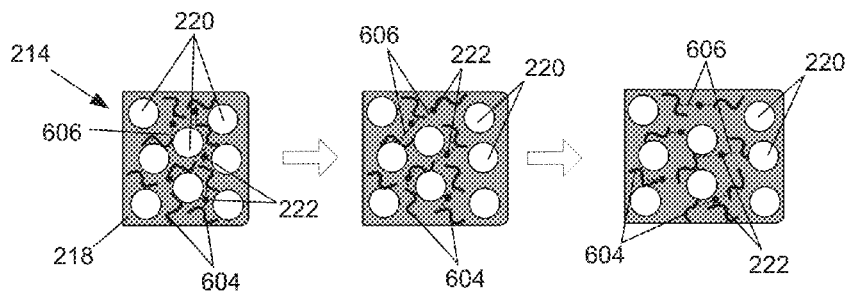
FIG. 6B

NARROW-GAP FLIP CHIP UNDERFILL COMPOSITION

TECHNICAL FIELD

Embodiments described herein generally relate to apparatuses and methods for packaging a device. In particular, embodiments described herein relate to underfilling processes and materials used for packaging a device.

BACKGROUND

Semiconductor chips, such as processor chips, can be housed in chip packages, which are subsequently attached to circuit boards in the manufacture of a number of electronic devices. One common configuration of input/output connections between chips, substrates, packages, and adjacent circuit boards, etc. includes solder connection arrays.

There are a number of design concerns that can be taken into account when forming solder arrays. High mechanical strength and reliability of the solder connections can be desirable. In solder connection arrays, chips, substrates, chip packages, and circuit boards can expand and contract at different rates due to differences in the coefficient of thermal expansion (CTE) in each component. The differences in CTE can cause unwanted stresses and strains in resulting products. Powering up and down and use of the device can result in thermal stress on the components of the device.

One method that has been used to counter thermal stresses due to differences in CTE has been to use underfill compositions, for example between chips and circuit boards or other substrates, that can mitigate differences in CTE and reduce thermal stresses due to operation of the device. Due to miniaturization efforts, circuits are being crowded into smaller geometries. In addition, multiple chips can be crowded into smaller packages. Flip-chip configurations are affected by the miniaturization because mounting space is also shrinking. Consequently, underfill compositions must fill smaller spaces.

BRIEF DESCRIPTION OF THE DRAWINGS

FIG. 4A shows filler particle interaction within an underfill composition comprising only microparticles.

FIG. 4B shows filer particles interaction within an underfill composition comprising microparticles and nanoparticles in accordance with some embodiments of the invention.

FIG. 5A shows the effect of filler particle and resin separation within an underfill composition comprising only microparticles.

FIG. 5B shows the reduction in filler particle and resin separation within an underfill composition comprising microparticles and nanoparticles in accordance with some embodiments of the invention.

FIG. 6A shows a jamming effect of filler particles within an underfill composition comprising only microparticles.

FIG. 6B shows a reduction in the jamming effect for an underfill composition comprising microparticles and nanoparticles in accordance with some embodiments of the invention.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
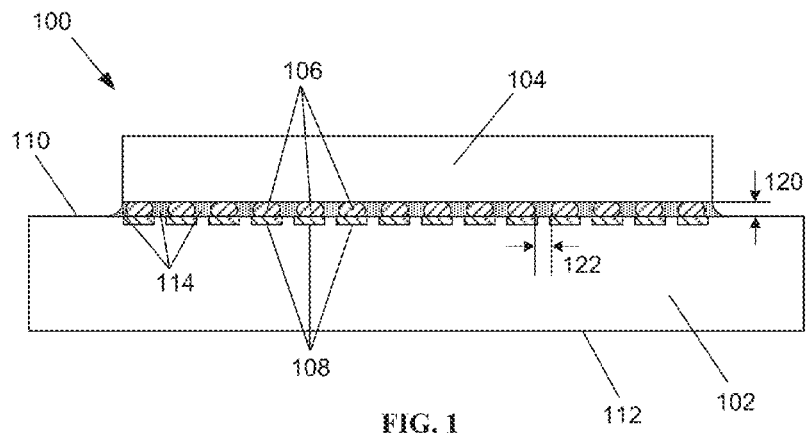
FIG. 1 is a cross-sectional view of an example electronic device in accordance with some embodiments of the invention.

FIG. 1 shows a cross-sectional representation of an electronic device 100. The electronic device 100 can include a substrate 102 with a semiconductor chip 104 coupled to the substrate 102. As shown in the example of FIG. 1, the semiconductor chip 104 can be coupled to the substrate 102 by a plurality of solder interconnection joints 106, also referred to herein as solder joints 106. Examples of semiconductor chips 104 include, but are not limited to, processor chips, memory chips, logic chips, and the like. The solder joints 106 can each be bonded to a metalized bond pad 108, for example on a top surface 110 of the substrate 102. Additional solder interconnections can be included on a bottom surface 112 for connection to additional devices, such as a circuit board (not shown).

An underfill composition 114 can be dispensed between the substrate 102 and the semiconductor chip 104. The underfill composition 114 can protect the solder joints 105, e.g., by having a coefficient of thermal expansion (CTE) of the underfill composition 114 substantially match a CTE of the solder joints 106, and/or by configuring the CTE of the underfill composition 114 to accommodate a difference in the CTEs of the substrate 102 and the semiconductor chip 104 so that thermal stresses due to thermal expansion and contraction will not cause the device 100 to mechanically fail. The underfill composition 114 can be configured to flow through the narrow gaps and passages between the substrate 102 and the semiconductor chip 104 and between the plurality of solder joints 106. In an example, the underfill composition 114 can be configured to flow through the space between the substrate 102 and the semiconductor chip 104 via capillary action.

Capillary action can occur due to a small gap 120 between the substrate 102 and the semiconductor chip 104, also referred to herein as a "chip gap 120," and a small lateral spacing 122 between adjacent solder joints 106, also referred to herein as "annular spacing 122" around a solder joint 106, as shown in FIG. 1. The continuing trend of miniaturization of semiconductor chips and the desire for continued size reduction of electronic devices has resulted in smaller and smaller chip gaps and smaller and smaller annular spacing. As the chip gap and annular spacing are reduced, the cross-sectional area through which the underfill composition 114 can flow due to capillary action becomes smaller. The smaller and smaller cross-sectional area for the passage of the underfill composition 114 can make underfill flow more and more difficult. If the viscosity is too large, then the underfill composition 114 may not fully fill the void space between the substrate 102 and the semiconductor chip 104 around all of the solder joints 106. If the underfill composition 114 does not fill all or nearly all of the void space between the substrate 102 and the semiconductor chip 104, then the reduction in thermal strain due to mismatched CTEs may not be achieved by the underfill composition 114.

For example, in previous and current generations of Intel® processors, the chip gap is about 40-50 micrometers (μm) and the annular spacing is about 30-40 μm. For future generations, it will be desirable to have even smaller chip gaps and annular spacing, such as a chip gap of 30 μm or less and an annular spacing of 20 μm or less. Such a small chip gap and annular spacing can result in a corresponding cross-sectional area for the flow of the underfill composition 114 that is at least two to three times smaller than the cross-sectional area of the Intel® 1270 and 1272 generations.

In an example, the underfill composition 114 of the present invention, as described herein, is capable of filling all of the void space between the substrate 102 and the semiconductor chip 104 and around the solder joints 106, or nearly all of the void space (e.g., at least 95% of the void space, for example at least 96%, at least 96.5% at least 97%, at least 97.5%, at least 98%, at least 98.1%, at least 98.2%, at least 98.3%, at least 98.4%, at least 98.5% at least 98.6%, at least 98.7%, at least 98.8%, at least 98.9%, at least 99%, at least 99.1%, at least 99.2%, at least 99.3%, at least 99.4%, at least 99.5%, at least 99.6%, at least 99.7%, at least 99.8%, at least 99.9 at least, at least 99.95%, at least 99.96%, at least 99.97%, at least 99.98%, at least 99.99%, and at least 99.999% of the void space) for a chip gap of 20 μm or less (e.g., a chip gap of 20 μm, 19 μm, 18 μm, 17 μm, 16 μm, 15 μm, 14 μm, 13 μm, 12 μm, 11 μm, 10 μm, 9 μm, 8 μm or less) and an annular space of 30 μm or less (e.g., an annular spacing of 30 μm, 29 μm, 28 μm, 27 μm, 26 μm, 25 μm, 24 μm, 23 μm, 22 μm, 21 μm, 20 μm, 19 μm, 18 μm, 17 μm, 16 μm, 15 μm, 14 μm, 13 μm, 12 μm, 11 μm, 10 μm, 9 μm, 8 μm or less), or both.

The primary parameter that dictates whether a particular underfill composition is capable of filling a particular narrow-gap space via capillary filling is the viscosity of the underfill composition. For smaller chip gaps and annular spacing, the viscosity of the underfill composition must be smaller, indicating an easier to flow material. In an example, the underfill composition 114 of the present invention can have a viscosity of less than or equal to about 1 pascal·seconds (Pa·s), for example less than or equal to about 0.8 pascal·seconds (Pa·s) for a small die area to be filled (e.g., less than or equal to about 400 mm², or a 20 mm×20 mm die), or less than or equal to about 0.5 Pa·s for a large die area to be filled (e.g., greater than about 400 mm², for example a 25 mm×35 mm (875 mm²) die).

Figure 2:
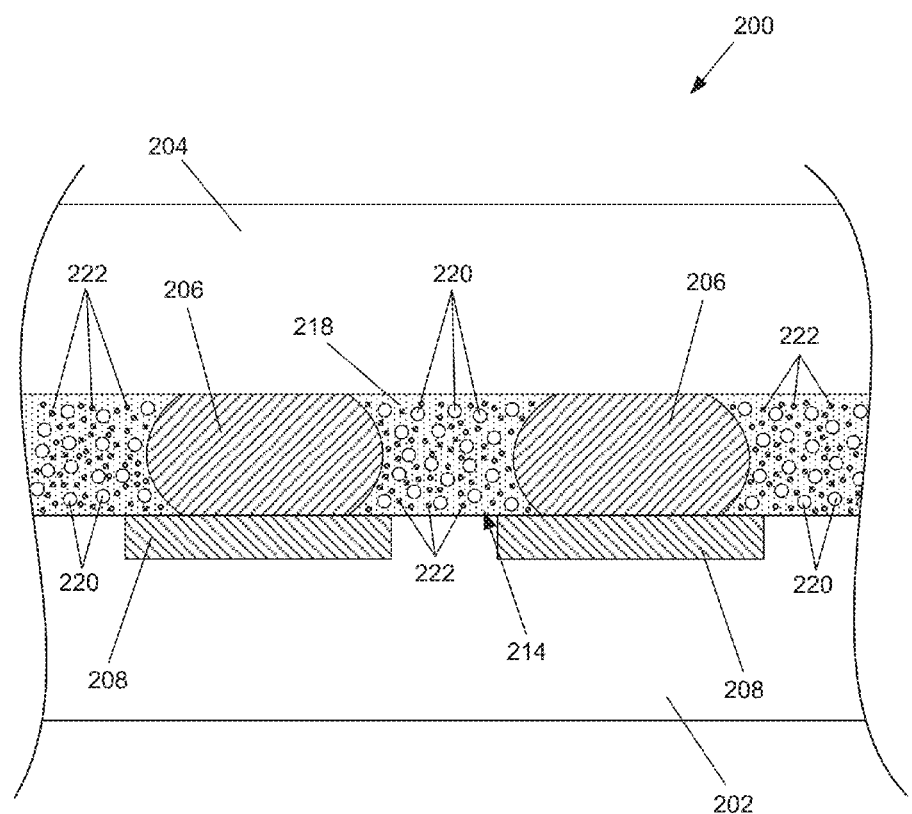
FIG. 2 is a close-up cross-sectional of an underfill composition for use in an electronic device in accordance with some embodiments of the invention.

FIG. 2 shows a close-up view of an example device 200 similar to the device 100 shown in FIG. 1. The device 200 includes a substrate 202 and a semiconductor chip 204 bonded to the substrate 202 via a plurality of solder joints 206 bonded to bond pads 208 on the substrate 202. An underfill composition 214 has been filled into the void space between the substrate 202 and the semiconductor chip 204 and between the solder joints 206.

The underfill composition 214 includes a resin composition 218 and a plurality of filler particles 220, 222 loaded within the resin composition 218. The resin composition 218 can comprise an initially liquid composition that is capable of hardening or setting upon exposure to a triggering stimulus, such as a thermosetting epoxy resin triggered by being heating to a triggering temperature. The resin composition 218 can have particular flowing characteristics when in the liquid form, such as a predetermined viscosity (at 110° C.) of from about 0.0005 Pa·s to about 0.05 Pa·s, for example from about 0.005 Pa·s to about 0.02 Pa·s.

After setting to a solid or semi-solid state, the resin composition 218 can have certain desired mechanical properties, such as a bonding strength sufficient to maintain a bonded contact with the substrate 202 and the semiconductor chip 204 and a toughness or resiliency that can withstand thermal cycling during operation of the device 200. In an example, the resin 218, when cured, can have a Young's modulus of from about 4 to about 15 GPa and a glass transition temperature of from about 80° C. to about 160° C.

The resin composition 218 can also have certain desired thermal properties, such as a desired CTE to provide for an overall CTE of the underfill composition 214 that can provide for a predetermined thermal matching between the CTE of the substrate 202 and the CTE of the semiconductor chip 204. In an example, the resin composition 218, when cured, has a CTE of from about 20 ppm/° C. to about 120 ppm/° C. In an example, the resin 218 can have a CTE below its glass transition temperature of from about 20 ppm/° C. to about 40 ppm/° C. and a CTE above its glass transition temperature of from about 60 ppm/° C. to about 120 ppm/° C.

The resin composition 218 can also have certain desired electrical properties, such as a high electrical resistivity so that the resin composition 218 does not conduct electricity between the bond pads 208 and the semiconductor chip 204. In an example, the resin composition 218 has an electrical resistivity of at least $10^{12}$ ohm·centimeters (Ω·cm), for example at least about $10^{18}$ Ω·m, such as about $1.8 \times 10^{18}$ Ω·cm. The resin composition 218 can have a dielectric constant of at least about 3, such as about 3.5. The resin composition 218 can have a breakdown voltage (at 10 micrometer thickness) of greater than 5 kV, such as greater than 7 kV.

In an example, the resin composition 218 can be a curable epoxy resin composition comprising an epoxy resin, for example, but not limited to, cycloaliphatic epoxy resins, bisphenol-A type epoxy resins, bisphenol-F type epoxy resins, novolac epoxy resins, biphenyl type epoxy resins, naphthalene type epoxy resins, dicyclopentadiene-phenol type epoxy resins, and mixtures thereof. The expoxy resin composition can also include a cross-linking agent or a curing agent, such as a monofunctional or polyfunctional anhydride polymer or an oligomer curing agent, or both. Non-limiting examples of resins that are used for underfill compositions in electronic devices are disclosed in U.S. Pat. No. 7,202,304, issued on Apr. 10, 2007, assigned to the assignee of this application, which is incorporated herein by reference in its entirety.

In an example, the filler particles 220, 222 can comprise a material with an appropriate CTE to provide for the overall desired CTE of the underfill composition 214. The filler particles 220, 222 can comprise an inorganic material within the desired CTE range. The filler particles 220, 222 can also have other desirable properties, such as a relatively high electrical resistivity, e.g., at least about $10^{15}$ Ω·cm, for example at least about $10^{17}$ Ω·cm, for example about $7 \times 10^{17}$ Ω·cm. The filler particles 220, 222 can have a dielectric constant of at least about 3, such as about 3.8. The filler particles 220, 222 can have a breakdown voltage (at a thickness of 10 micrometers) of at least about 5 kV, such as at least about 8 kV. The filler particles 220, 222 can also have a relatively low thermal conductivity, e.g., less than about 2 W/(m·K), such as less than about 1.5 W/(m·K), for example less than 1 W/(m·K).

Examples of materials from which the filler particles 220, 222 can be formed include, but are not limited to, silica ($SiO_2$), alumina ($Al_2O_3$), titanium dioxide ($TiO_2$), boron trioxide ($B_2O_3$) aluminum nitride (AlN), boron nitride (BN), graphite, diamond dust, clays, and silicon carbide (SiC). In particular, silica can be desirable for forming the filler particles 220, 222 because silica has desirable properties and is abundant and inexpensive.

The filler particles 220, 222 can be loaded into the resin composition 218 to provide for a desired thermoresponsive property of the underfill composition, such as a desired CTE of the final, set underfill composition 214. In an example, the filler particles 220, 222 can be added so as to adjust the CTE of the underfill composition 214 to more closely match a CTE of the solder joints 206, e.g., if the underfill composition 214 is to protect the solder joints 206, or in some example, to drive the overall CTE of the underfill composition 214 to as low as is practical. For example, in the case of a device 200 that is to be used as a computer processor, a desired final CTE for the full underfill composition 214 can be less than the about 40-120 ppm/° C. of the resin 218 by itself. The CTE of the filler particles 220, 222 can be lower than that of the resin composition 218 so that the filler particles 220, 222 act to reduce the overall CTE of the underfill composition 214. In an example, the CTE of the filler particles 220, 222 can be less than or equal to 15 ppm/° C., for example less than or equal to 10 ppm/° C., such as less than or equal to about 5 ppm/° C. In the case of silica particles 220, 222, the CTE is less than 1 ppm/° C., e.g., about 0.5 ppm/° C., and in some cases can be approximately 0 ppm/° C.

The total loading, on a weight basis, of the filler particles 220, 222 can be sufficiently high in order to provide for the desired CTE of the underfill composition 214. The total loading of the filler particles 220, 222 can be from 40 wt. % to 75 wt. %, such as from 50 wt. % to 70 wt. %, for example about 65 wt. % of the underfill composition 214 (e.g., grams of filler particles 220, 222 per 100 g of the underfill composition 214). The desired total loading of the filler particles 220, 222 within the underfill composition 214 can depend on a number of factors, including, but not limited to, the resulting CTE of the underfill composition 214, the resulting viscosity of the underfill composition 214, and the size of the opening that the underfill composition 214 is to fill (e.g., the size of the chip gap 120 and the annular spacing 122 described above with respect to FIG. 1).

The filler particles 220, 222 can comprise first filler particles 220 having a first particle size and second filler particles 222 having a second particle size. As shown in the example shown in FIG. 2, the first filler particles 220 can be larger than the second filler particles 222. The relative sizes of the first filler particles 220 and the second filler particles 222 shown in the figures are meant for illustrative purposes only and do not necessarily represent the actual relative sizes of the first filler particles 220 relative to the second filler particles 222.

In an example, the first particle size of the first filler particles 220 is greater than 0.1 micrometers (μm) and less than 15 μm, for example from about 0.5 μm to about 10 μm. In an example, the first filler particles 220 have an average size of from about 0.1 μm to about 3 μm, such as an average particle size of about 0.5 μm, and a maximum particle size of from about 3 μm to about 15 μm, such as a maximum particle size of about 5 μm. Therefore, the first filler particles 220 can be described as being on the micrometer scale such that the first filler particles 220 are also referred to herein as "microparticles 220."

The second particle size of the second filler particles 222 can be less than 100 nm, such as less than or equal to 50 nm, for example less than or equal to 10 nm. In some examples, the second filler particles 222 can be as small as about 5 nm. Therefore, the second filler particles 222 can be described as being on the nanometer scale such that the second filler particles 222 are also referred to herein as "nanoparticles 222."

In an example, at least some of the nanoparticles 222 can have an average size of about 50 nm and can have a size distribution of ±about 5 nm, e.g., can be in the range of from about 45 nm to about 55 nm. In another example, at least some of the nanoparticles 222 can have an average size of about 10 nm and can have a size distribution of ±about 3 nm, e.g., can be in the range of from about 7 nm to about 13 nm.

Conventional underfill compositions tended to only use filler particles that had a size of greater than 0.1 μm, and generally at least 0.5 μm to 5 μm in size. If particles smaller than 0.1 μm were used at a particle loading weight percentage needed to reach a desired CTE, the resulting underfill composition would tend to have a large viscosity that was much too high for the small chip gap and annular spacing of electronic devices.

It has been found by the inventors that for the desired narrow-gap spacing of future generations of electronic devices (e.g., chip gaps of 30 μm or less and annular spacing of 20 μm or less), even using filler particles on the micrometer scale, such as 0.5 μm to 5 μm particles, will not fully penetrate the space between a substrate and a semiconductor chip, leaving substantial portions of voids in the chip gap space, e.g., voids taking up as much as a few percent or more of the total chip gap space being unfilled by the underfill composition. When substantial void space is left unfilled, electronic devices can have a substantially higher failure rate due to stress from thermal cycling of the device.

The inventors have found that adding a small amount of nanoparticles 222, e.g., filling particles having a size less than or equal to about 100 nanometers (nm), for example less than or equal to about 50 nm, can result in a reduction in the viscosity of the underfill composition 214 below that which would have been expected for the underfill composition having just the microparticles 220. This result is contrary to what has been demonstrated in the literature and the art, where the large relative surface area of nanoparticles has been shown to intensify the effect of particle-to-particle and particle-to-resin thermodynamic interactions, and thus to increase the viscosity of the fluid into which the nanoparticles are loaded. The inventors have found that, surprisingly, when the weight percentage of the nanoparticles 222 is below or proximate to a small cutoff threshold loading weight percentage, the viscosity of the underfill composition 214 can be reduced as the result of what appears to be a nanoparticle lubrication effect.

The term "cutoff threshold," as used herein, can refer to a loading weight percentage of nanoparticles where the viscosity of the underfill composition 214 reaches a minimum such that a loading of the nanoparticles above the cutoff threshold results in an increased viscosity compared to the minimum at the cutoff threshold. When the loading of the nanoparticles 222 approaches the cutoff threshold, the increased nanoparticle-to-nanoparticle and nanoparticle-to-resin interactions can begin to dominate over the interactions among the microparticles 220 and between the microparticles 220 and the resin composition 218, leading to the viscosity increase predicted by the literature.

Figure 3:
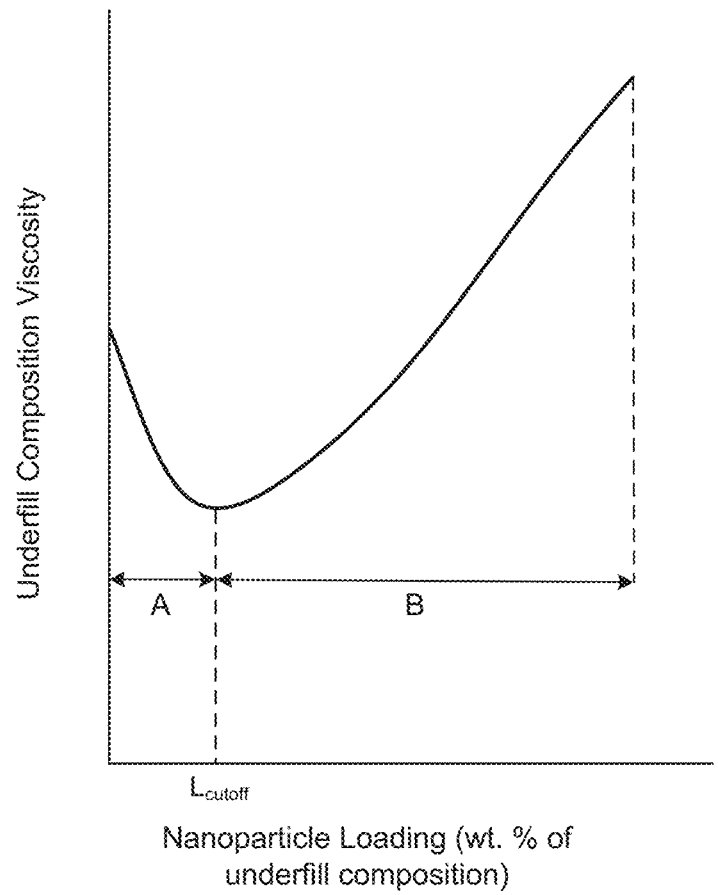
FIG. 3 is a graph showing a relationship between nanoparticle loading and viscosity of the underfill composition in accordance with some embodiments of the invention.

FIG. 3 shows an example graphical representation of the relationship between the loading of the nanoparticles 222 and the viscosity of the underfill composition 214 comprising both microparticles 220 and nanoparticles 222. As shown in FIG. 3, for a small initial range of nanoparticle loading (represented by Zone A in FIG. 3), the nanoparticle lubrication effect dominates over the nanoparticle-to-nanoparticle and nanoparticle-to-resin interactions and the viscosity of the underfill composition viscosity decreases. As the nanoparticle loading approaches a cutoff threshold loading $L_{cutoff}$, the nanoparticle-to-nanoparticle and nanoparticle-to-resin interactions begin to counteract the nanoparticle lubrication effect and the viscosity reduction per nanoparticle loading slows down. At the cutoff threshold $L_{cutoff}$, the nanoparticle-to-nanoparticle and nanoparticle-to-resin interactions overtake the nanoparticle lubrication effect and the viscosity of the underfill composition begins to increase (represented by Zone B in FIG. 3).

Without being bound by any theory, the inventors hypothesize that the nanoparticle lubrication effect occurs due to one or more of the following factors: (1) filler packing effects; (2) particle-resin separation effects; and (3) particle jamming effects.

FIGS. 4A and 4B conceptually show the filler packing effects that can be improved by the presence of nanoparticles 222 in the underfill composition 214. As shown in FIG. 4A, when only microparticles 220 are present, the gap spacing G between adjacent microparticles 220 as a result of the filler loading weight percentage (e.g., assuming a substantially uniform distribution of the microparticles 220 within the resin composition 218) can be smaller than the diameter $D_M$ of the microparticles 220. This can result in lower-density packing of the microparticles 220 resulting in a higher viscosity of the underfill composition 214. In contrast, as shown in FIG. 4B, the nanoparticles 222 can fit freely within the gap G between microparticles 220, which in turn can provide for an increase in overall packing density of the filler particles 220, 222. The increased packing density can lead to an increase in the distance between microparticles 220 (e.g., a larger gap G), which can result in the decreased viscosity of the underfill composition 214.

FIGS. 5A and 5B conceptually show the particle-resin separation effects that can be improved by the presence of nanoparticles 222 in the underfill composition 214. As shown in FIG. 5A, as an underfill composition 501 having only microparticles 220 flows, the larger size of the microparticles 220 can result in temporary jamming of the particles which can prevent movement of the microparticles 220 in the direction of flow $D_{Flow}$. While the microparticles 220 are jammed and stagnant, the resin composition 218A and the microparticles 220 can separate and form a void 502A at the underfill composition flow front. When the resin composition 218B around the microparticles 220 include nanoparticles (not shown in FIG. 5B for the sake of simplicity), the stronger interactive forces between the nanoparticles and the resin composition 218B can reduce or eliminate the likelihood of separation between the resin composition 218B and the filler particles, both the microparticles 220 and the nanoparticles 222. The reduction or elimination of resin-particle separation can result in a more uniform flow front of the underfill composition 214 as it flows in the direction $D_{Flow}$, as demonstrated by the formation of a smaller void 502B, or even a void free underfill, as in the example of FIG. 5B.

FIGS. 6A and 6B conceptually show the particle jamming effects that can be improved by the presence of nanoparticles 222 in the underfill composition 214. FIG. 6A shows three different stages during the flow of an underfill composition 601 that only includes microparticles 220 as the underfill composition 601 flows in the direction of flow $D_{Flow}$. As described above, the microparticles 220 can become jammed due to their larger particle size. The jamming can result in the formation of a void that trails behind the jammed microparticle 220 to form a long void 602 as the flow of the underfill composition 601 continues. Unlike the void 502A formed as a result of resin-particle separation described with respect to FIG. 5A, the void 602 forms because the jammed microparticles 220 block the flow of both the microparticles 220 and the resin composition 218 so that the flow front merges from the sides and a void is trapped.

FIG. 6B shows a corresponding three stages during the flow of the underfill composition 214 that includes nanoparticles 222. As the underfill composition 214 flows, the nanoparticles 222 can act as a lubricant between the microparticles 220 to prevent or reduce jamming of the microparticles 220. The lubricating effect can occur because the nanoparticles 222 themselves fit between the microparticles 220, or because of the increased interactive forces, such as hydrogen bonding or van der Waals forces, between the nanoparticles 222 and epoxy molecules 604 within the resin composition 218 (shown conceptually as the dashed lines 606 in FIG. 6B) allow the epoxy molecules 604 to act as a lubricant. As with the particle-resin separation hypothesis shown in FIGS. 5A and 5B, the particle jamming hypothesis also indicates that the underfill composition 214 that includes nanoparticles 222 will result in a more uniform flow front compared to the underfill composition 601 that only includes microparticles 220.

The value of the cutoff threshold loading $L_{cutoff}$ (FIG. 3) at which the viscosity of the underfill composition 214 reaches its minimum before beginning to increase can depend on a number of factors, including, but not limited to, the size of the nanoparticles 222 (e.g., the diameter of the nanoparticles 222), the total filler loading within the underfill composition 214, and, to a lesser extent, the size of the microparticles 220. The inventors have found that the size of the nanoparticles 222 appears to be the controlling factor in what the actual cutoff threshold loading $L_{cutoff}$ will be. For example, for nanoparticles 222 having a particle size of about 50 nm, the cutoff threshold loading $L_{cutoff}$ is from about 5 wt. % to about 10 wt. % when the total loading of the filler particles 220, 222 is about 65 wt. %. In comparison, for nanoparticles having a particle size of about 10 nm, the cutoff threshold loading $L_{cutoff}$ is considerably lower, e.g., 1 wt. % or less when the total loading of the filler particles 220, 222 is about 65 wt. %.

In another example, the underfill composition 214 of the present invention can include microparticles 220 having a plurality of sizes, e.g., a first set of microparticles 220 having a first size and a second set of microparticles 220 having a second size, wherein both the first and second size are from 0.1 μm to 15 μm. Similarly, the underfill composition 214 can include nanoparticles 222 having a plurality of sizes. In an example, in addition to microparticles 220, the underfill composition 214 can include a first set of nanoparticles 222 having a first size and a second set of nanoparticles 222 that have a second size that is smaller than the first size.

The loading of each set of nanoparticles 222 can depend on the respective cutoff threshold loading $L_{cutoff}$ for each particular size of nanoparticles 222. For example, if the first set of nanoparticles 222 have a size of about 50 nm and the second set of nanoparticles 222 have a size of about 10 nm, the first (50 nm) nanoparticles 222 can be loaded at about 10 wt. % of the underfill composition 214 and the second (10 nm) nanoparticles 222 can be loaded at about 1 wt. % of the underfill composition 214. In an example, a loading of the first set of nanoparticles 222 (e.g., the 50 nm nanoparticles) can be below a first cutoff threshold loading value for the first size of nanoparticles (e.g., 50 nm), and a loading of the second set of nanoparticles 222 (e.g., the 10 nm nanoparticles) can be below a second cutoff threshold loading value for the second size of nanoparticles (e.g., 10 nm).

In an example, an underfill composition 214 that includes the first nanoparticles 222 and the smaller second nanoparticles 222 can reduce the viscosity further compared to a corresponding underfill composition that included just the first nanoparticles 222 (which in turn can reduce the viscosity compared to a corresponding underfill composition that only included microparticles 220 and no nanoparticles 222). The cutoff threshold loading $L_{cutoff}$ can depend on several factors including, but not limited to, the composition of the resin composition 218, the composition of the filler particles 220, 222, and the size of the filler particles 220, 222, particularly the size of the nanoparticles 222.

Figure 7:
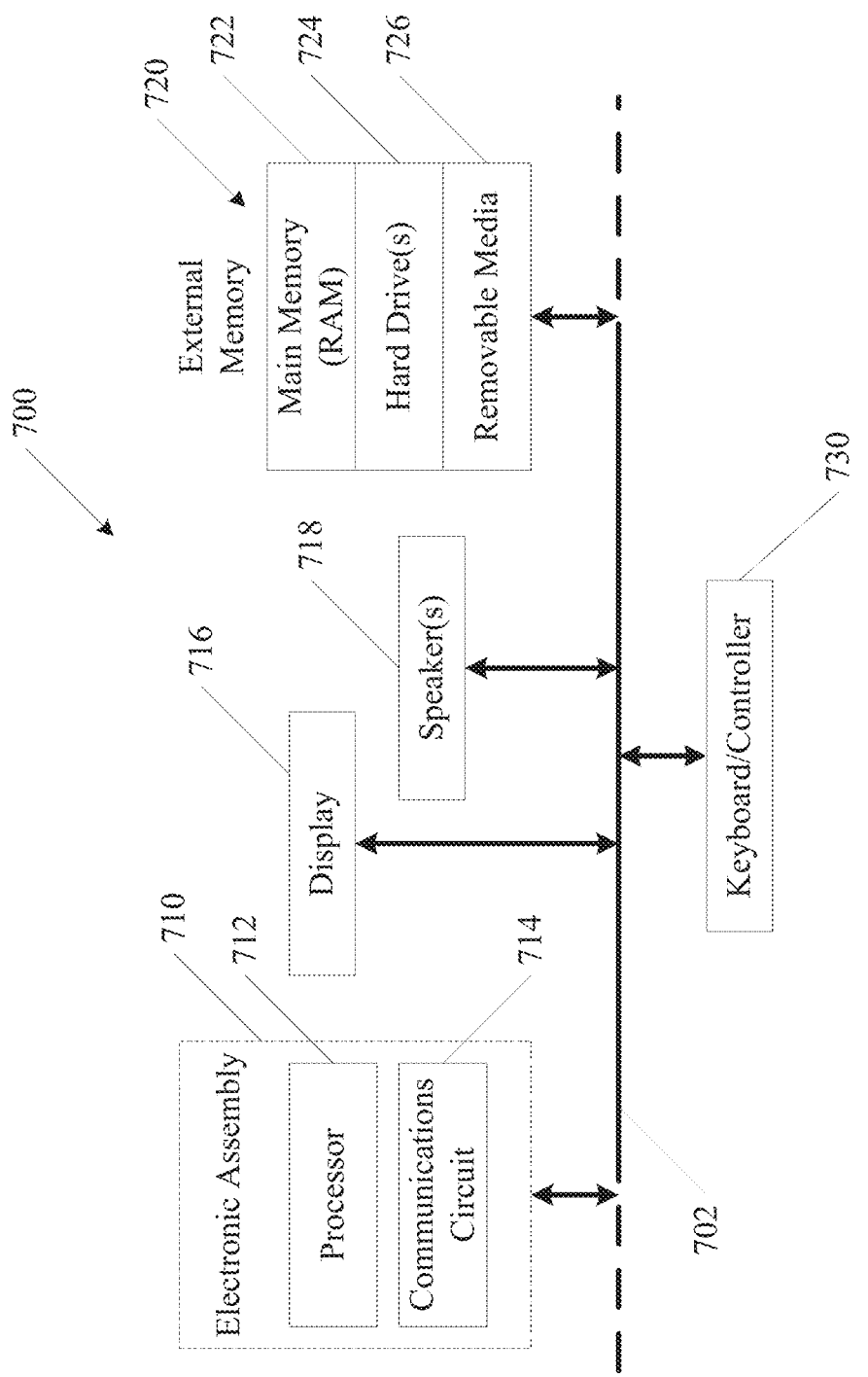
FIG. 7 is block diagram of an electronic system in accordance with some embodiments of the invention.

An example of an electronic device using electronic devices and solders as described in the present disclosure is included to show an example of a higher level device application for the present invention. FIG. 7 is a block diagram of an electronic device 700 incorporating an underfill composition in accordance with at least one embodiment of the invention. The electronic device 700 is merely one example of an electronic system in which embodiments of the present invention can be used. Examples of electronic devices 700 include, but are not limited to personal computers, tablet computers, mobile telephones, game devices, MP3 or other digital music players, etc. In this example, the electronic device 700 comprises a data processing system that includes a system bus 702 to couple the various components of the system. The system bus 702 provides communications links among the various components of the electronic device 700 and can be implemented as a single bus, as a combination of busses, or in any other suitable manner.

An electronic assembly 710 is coupled to system bus 702. The electronic assembly 710 can include any circuit or combination of circuits. In one embodiment, the electronic assembly 710 includes a processor 712 which can be of any type. As used herein, "processor" can refer to any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), a multiple core processor, or any other type of processor or processing circuit.

Other types of circuits that can be included in the electronic assembly 710 are a custom circuit, an application-specific integrated circuit (ASIC), or the like, such as, for example, one or more circuits (such as a communications circuit 714) for use in wireless devices like mobile telephones, personal data assistants, portable computers, two-way radios, and similar electronic systems. The circuit or circuits can perform any other type of function.

The electronic device 700 can also include an external memory 720, which in turn can include one or more memory elements suitable to the particular application, such as a main memory 722 in the form of random access memory (RAM), one or more hard drives 724, and/or one or more drives that handle removable media 726 such as compact disks (CD), flash memory cards, digital video disk (DVD), and the like.

The electronic device 700 can also include a display device 716, one or more speakers 718, and a keyboard, controller, or other input device 730, which can include a mouse, trackball, touch screen, voice-recognition device, or any other device that permits a system user to input information into and receive information from the electronic device 700.

EXAMPLES

Comparative Example 1

The underfill composition of Comparative Example 1 was formed by loading microparticles having an average size of about 0.5 μm and a maximum size of about 5 μm (referred to in the Examples as "microparticles") into an epoxy-based resin. The microparticles were loaded at 65 wt. % of the total underfill composition. The underfill composition of Comparative Example 1 has a viscosity at 100° C. of about 0.136 Pa·s.

Example 2

The underfill composition of Example 2 loads the same microparticles into the same epoxy resin as in Comparative Example 1. However, nanoparticles having an average size of about 50 nm and a size distribution of ±about 5 nm (referred to in the Examples as "50 nm nanoparticles") were also loaded into the epoxy resin along with the microparticles. The 50 nm nanoparticles were loaded at 5 wt. % of the total underfill composition, and the loading of the microparticles was reduced to 60 wt. % so that the total loading of both the nanoparticles and the microparticles was 65 wt. %. The underfill composition of Example 2 has a viscosity at 100° C. of about 0.092 Pa·s.

Example 3

The underfill composition of Example 3 was substantially the same as that of Example 2 except that the 50 nm nanoparticles were loaded at 10 wt. % and the loading of the microparticles was further reduced to 55 wt. % so that the total loading of the nanoparticles and the microparticles remained at 65 wt. %. The underfill composition of Example 3 has a viscosity at 100° C. of about 0.118 Pa·s.

Example 4

The underfill composition of Example 4 was substantially the same as that of Examples 2 and 3 except that the 50 nm nanoparticles were loaded at 15 wt. % and the loading of the microparticles was further reduced to 50 wt. % so that the total loading of the nanoparticles and the microparticles remained at 65 wt. %. The underfill composition of Example 4 has a viscosity at 100° C. of about 0.182 Pa·s.

Example 5

The underfill composition of Example 5 was substantially the same as that of Example 4, with an additional set of nanoparticles having an average size of 10 nm and a size distribution of ±about 3 nm (referred to in the Examples as "10 nm nanoparticles") nanoparticles were also loaded into the epoxy resin in addition to the 50 nm nanoparticles and the microparticles. The 10 nm nanoparticles were loaded at 1 wt. %, the 50 nm nanoparticles were loaded at 10 wt. %, and the microparticles were loaded at 54 wt. % so that the total loading of the nanoparticles and the microparticles remained at 65 wt. %. The underfill composition of Example 5 is configured so that the surface area of nanoparticles in the underfill composition of Example 5 (e.g., the total surface area of the 1 wt. % of the 10 nm nanoparticles and the 10 wt. % of the 50 nm nanoparticles) is substantially the same as the surface area of nanoparticles in Example 4 (e.g., the surface area of the 15 wt. % of the 50 nm nanoparticles). The underfill composition of Example 5 has a viscosity at 100° C. of about 0.121 Pa·s.

Table 1 summarizes the formulations and the resulting viscosities of each of the underfill compositions of Comparative Example 1 and Examples 2-5.

TABLE 1

|  | Comp. Example 1 | Example 2 | Example 3 | Example 4 | Example 5 |
| --- | --- | --- | --- | --- | --- |
| 50 nm nanoparticles (wt. %) | 0 | 5 | 10 | 15 | 10 |
| 10 nm nanoparticles (wt. %) | 0 | 0 | 0 | 0 | 1 |
| Microparticles (wt. %) | 65 | 60 | 55 | 50 | 54 |
| Viscosity @ 100° C. (Pa · s) | 0.136 | 0.092 | 0.118 | 0.182 | 0.121 |

Figure 8A:
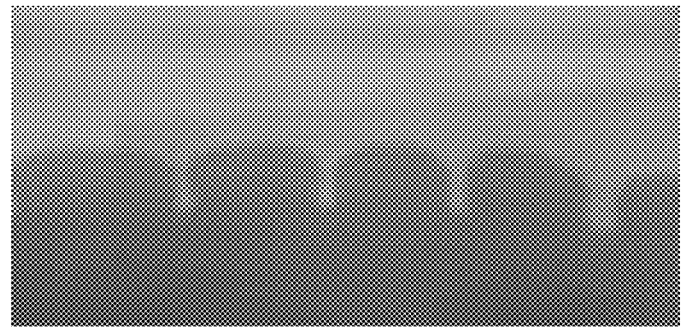
FIG. 8A shows a non-uniform flow front of the capillary underfilling of an underfill composition comprising only microparticles.
Figure 8B:
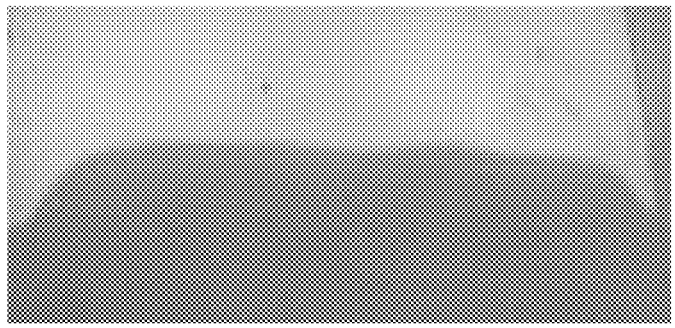
FIG. 8B shows a substantially uniform flow front the capillary underfilling of an underfill composition comprising microparticles and nanoparticles in accordance with some embodiments of the invention.

The addition of nanoparticles can provide for a more uniform flow front in narrow-gap electronics devices (e.g., a chip gap of 30 μm and an annular spacing of 20 μm) compared to an underfill composition that only includes microparticles. FIG. 8A shows the flow front of an underfill composition that is loaded with only microparticles at 65 wt. % (Comparative Example 1). FIG. 8B shows the flow front of an underfill composition that is loaded with 15 wt. % of 50 nm nanoparticles and 50 wt. % of microparticles (total filler loading of 65 wt. %) (Example 4).

The addition of nanoparticles can also provide for reduced or eliminated voiding of the capillary underfill composition and reduced or eliminated striation of the underfill composition during underfilling. The reduced or eliminated voiding and striation due to the addition of nanoparticle filler has been shown to occur for both small die application (e.g., underfilling a semiconductor die of less than about 400 millimeters$^2$ (mm$^2$)) and large die application (e.g., underfilling a semiconductor die of greater than or equal to about 400 mm$^2$).

Figure 9A:
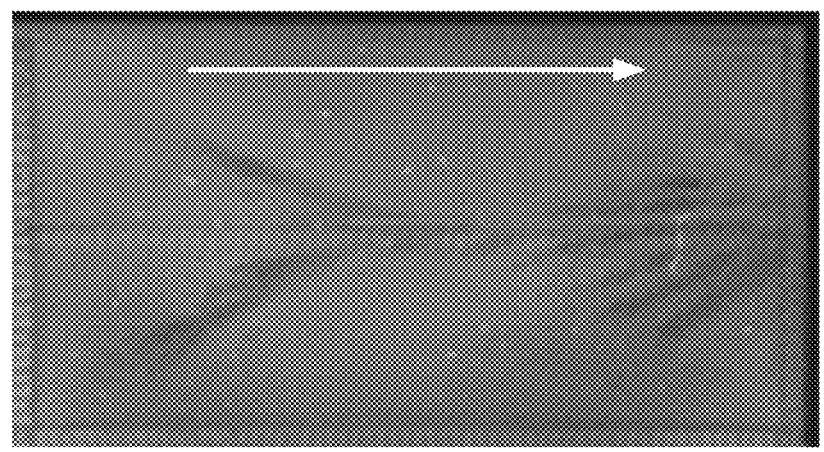
FIG. 9A shows a scanning acoustic micrograph of a small semiconductor die being underfilled by an underfill composition comprising only microparticles.
Figure 9B:
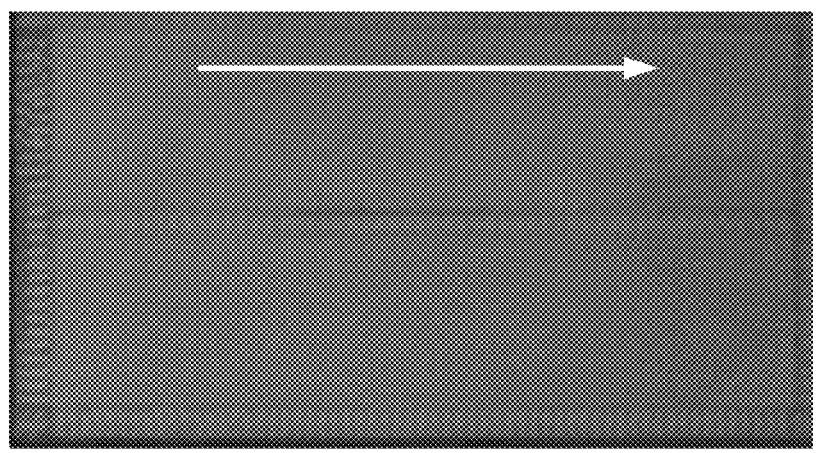
FIG. 9B shows a scanning acoustic micrograph of a small semiconductor die being underfilled by an underfill composition comprising microparticles and nanoparticles in accordance with some embodiments of the invention.

FIG. 9A shows a C-mod scanning acoustic micrograph image of a 20 mm×20 mm die (e.g., a "small die") with a chip gap of 30 μm between the die and the substrate and an annular spacing of 20 μm between solder joints that has been underfilled by the underfill composition of Comparative Example 1 (65 wt. % loading of only microparticles, no nanoparticles). FIG. 9B shows a corresponding C-mod scanning acoustic micrograph image of the same 20 mm×20 mm small die with the same 30 μm chip gap and 20 μm annular spacing using the underfill composition of Example 4 (15 wt. % 50 nm nanoparticles, total filler loading of 65 wt. %). The arrow in both FIGS. 9A and 9B indicate the direction of flow of the underfill compositions. As shown in FIG. 9A, the use of the underfill composition of Comparative Example 1 resulted in numerous voids (small white specks on the image) and striation of the underfill composition. In contrast, as shown in FIG. 9B, the underfill composition of Example 4 that includes nanoparticles shows no voiding and negligible striation.

Figure 10A:
FIG. 10A shows a scanning acoustic micrograph of a large semiconductor die being underfilled by an underfill composition comprising only microparticles.
Figure 10B:
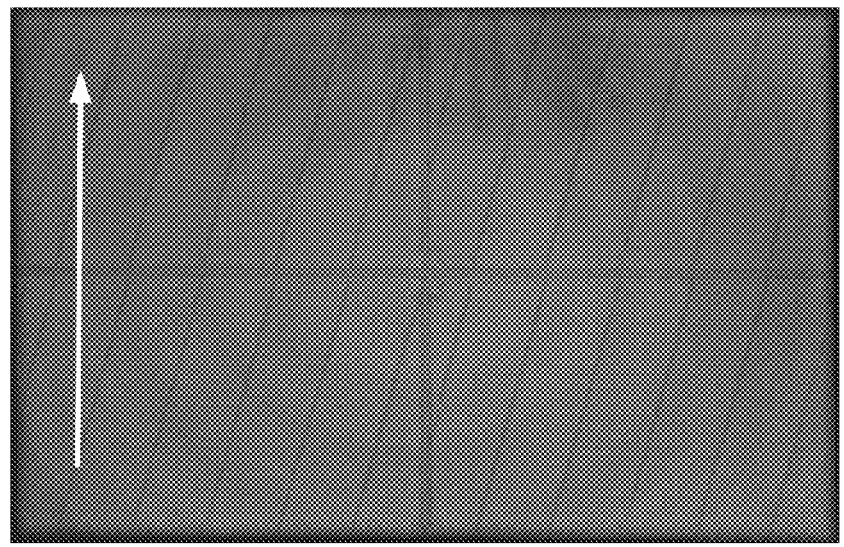
FIG. 10B shows a scanning acoustic micrograph of a large semiconductor die being underfilled by an underfill composition comprising microparticles and nanoparticles in accordance with some embodiments of the invention.

FIG. 10A shows a C-mod scanning acoustic micrograph image of a 25 mm×35 mm die (e.g., a "large die") with a chip gap of 30 μm between the die and the substrate and an annular spacing of 20 μm between solder joints that has been underfilled by the underfill composition of Comparative Example 1 (65 wt. % loading of only microparticles, no nanoparticles). FIG. 10B shows a C-mod scanning acoustic micrograph image of the same 25 mm×35 mm large die with the same 30 μm chip gap and 20 μm annular spacing using the underfill composition of Example 4 (15 wt. % 50 nm nanoparticles, total filler loading of 65 wt. %). The arrow in both FIGS. 10A and 10B indicate the direction of flow of the underfill compositions. As shown in FIG. 10A, the use of the underfill composition of Comparative Example 1 resulted in numerous voids (small white specks on the image), voids or trails, and striation of the underfill composition. In contrast, as shown in FIG. 10B, the underfill composition of Example 4 that includes nanoparticles shows no voiding and negligible striation.

Figure 11:
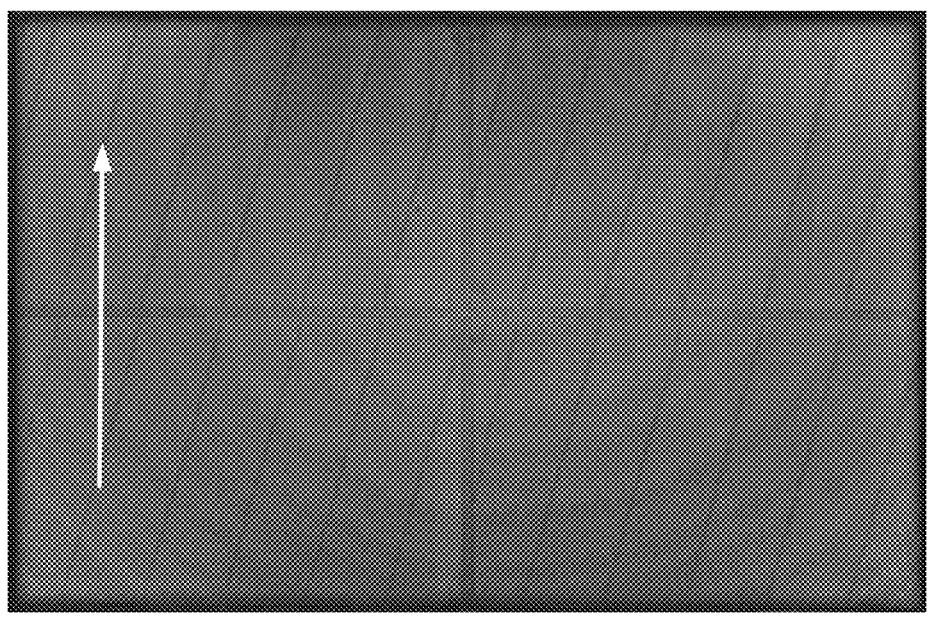
FIG. 11 shows a scanning acoustic micrograph of a large semiconductor die being underfilled by an underfill composition comprising microparticles and two sizes of nanoparticles in accordance with some embodiments of the invention.

FIG. 11 shows a C-mod scanning acoustic micrograph image of the same 25 mm×35 mm large die with the same 30 μm chip gap and 20 μm annular spacing as in FIGS. 10A and 10B, but using the underfill composition of Example 5 (10 wt. % loading of 50 nm nanoparticles. 1 wt. % loading of 10 nm nanoparticles, and 54 wt. % loading of microparticles, total filler loading of 65 wt. %). As shown in FIG. 11, using the underfill composition of Example 5 also resulted in no voiding and negligible striation.

To better illustrate the method and apparatuses disclosed herein, a non-limiting list of embodiments is provided here:

EMBODIMENT 1 can include subject matter (such as an apparatus, a device, a method, or one or more means for performing acts), such as can include an underfill composition comprising a curable resin, a plurality of filler particles loaded within the resin, the filler particles comprising at least 50 weight % of the underfill composition, the filler particles comprising first filler particles having a particle size of from 0.1 micrometers to 15 micrometers, and second filler particles having a particle size of less than 100 nanometers, wherein a viscosity of the underfill composition is less than a viscosity of a corresponding composition not including the second filler particles.

EMBODIMENT 2 can include, or can optionally be combined with the subject matter of EMBODIMENT 1, to optionally include the second filler particles having an average particle size of about 50 nanometers.

EMBODIMENT 3 can include, or can optionally be combined with the subject matter of one or any combination of EMBODIMENTS 1 and 2, to optionally include a weight percentage loading of the second filler particles being less or equal to about 15 weight % of the underfill composition.

EMBODIMENT 4 can include, or can optionally be combined with the subject matter of one or any combination of EMBODIMENTS 1-3, to optionally include the underfill composition having a viscosity of less than 0.8 pascal·seconds.

EMBODIMENT 5 can include, or can optionally be combined with the subject matter of one or any combination of EMBODIMENTS 1-4, to optionally include the underfill composition having a viscosity of less than or equal to 0.5 pascal·seconds.

EMBODIMENT 6 can include, or can optionally be combined with the subject matter of one or any combination of EMBODIMENTS 1-5, to optionally include the resin comprising a curable epoxy resin.

EMBODIMENT 7 can include, or can optionally be combined with the subject matter of one or any combination of EMBODIMENTS 1-6, to optionally include the resin, when uncured, having a viscosity of from 0.005 pascal·seconds to 0.02 pascal·seconds.

EMBODIMENT 8 can include, or can optionally be combined with the subject matter of one or any combination of EMBODIMENTS 1-7, to optionally include the first filler particles comprising at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

EMBODIMENT 9 can include, or can optionally be combined with the subject matter of one or any combination of EMBODIMENTS 1-8, to optionally include the second filler particles comprising at least one of silica (Si02), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

EMBODIMENT 10 can include, or can optionally be combined with the subject matter of one or any combination of EMBODIMENTS 1-9, to optionally include the coefficient of thermal expansion of the first filler particles being less than or equal to 15 ppm/° C.

EMBODIMENT 11 can include, or can optionally be combined with the subject matter of one or any combination of EMBODIMENTS 1-10, to optionally include the coefficient of thermal expansion of the second filler particles being less than or equal to 15 ppm/° C.

EMBODIMENT 12 can include, or can optionally be combined with the subject matter of one or any combination of EMBODIMENTS 1-11, to optionally include third filler particles having a particle size that is less than the particle size of the second filler particles.

EMBODIMENT 13 can include, or can optionally be combined with the subject matter of one or any combination of EMBODIMENTS 1-12, to optionally include the third filler particles comprising at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

EMBODIMENT 14 can include, or can optionally be combined with the subject matter of one or any combination of EMBODIMENTS 1-13, to optionally include the coefficient of thermal expansion of the third filler particles being less than or equal to 15 ppm/° C.

EMBODIMENT 15 can include, or can optionally be combined with the subject matter of one or any combination of EMBODIMENTS 1-14, to optionally include the total loading of the plurality of filler particles being from 40 weight % to 75 weight % of the underfill composition.

EMBODIMENT 16 can include, or can optionally be combined with the subject matter of one or any combination of EMBODIMENTS 1-15, to optionally include the first filler particles having an average size of from 0.1 micrometers to 3 micrometers.

EMBODIMENT 17 can include, or can optionally be combined with the subject matter of one or any combination of EMBODIMENTS 1-16, to optionally include a loading of the second filler particles being below or proximate to a cutoff threshold where the viscosity of the underfill composition begins to increase.

EMBODIMENT 18 can include, or can optionally be combined with the subject matter of one or any combination of EMBODIMENTS 1-17, to include subject matter (such as an apparatus, a device, a method, or one or more means for performing acts), such as can include a semiconductor package comprising a semiconductor chip, a substrate comprising a plurality of metalized contact pads, a plurality of solder joints bonding the semiconductor chip to the plurality of metalized contact pads, and an underfill composition filling a space between the semiconductor chip and the substrate and around the plurality of solder joints, wherein the underfill composition comprises a resin, and a plurality of filler particles loaded within the resin, the filler particles comprising at least 50 weight % of the underfill composition, the filler particles comprising first filler particles having a particle size of from 0.1 micrometers to 15 micrometers, and second filler particles having a particle size of less than 100 nanometers, wherein a viscosity of the underfill composition is less than a viscosity of a corresponding composition not including the second filler particles.

EMBODIMENT 19 can include, or can optionally be combined with the subject matter of one or any combination of EMBODIMENTS 1-18, to optionally include the second filler particles having an average particle size of about 50 nanometers.

EMBODIMENT 20 can include, or can optionally be combined with the subject matter of one or any combination of EMBODIMENTS 1-19, to optionally include a weight percentage loading of the second filler particles being less or equal to about 15 weight % of the underfill composition.

EMBODIMENT 21 can include, or can optionally be combined with the subject matter of one or any combination of EMBODIMENTS 1-20, to optionally include the underfill composition having a viscosity of less than 0.8 pascal·seconds.

EMBODIMENT 22 can include, or can optionally be combined with the subject matter of one or any combination of EMBODIMENTS 1-21, to optionally include the underfill composition having a viscosity of less than or equal to 0.5 pascal·seconds.

EMBODIMENT 23 can include, or can optionally be combined with the subject matter of one or any combination of EMBODIMENTS 1-22, to optionally include the resin comprising a curable epoxy resin.

EMBODIMENT 24 can include, or can optionally be combined with the subject matter of one or any combination of EMBODIMENTS 1-23, to optionally include the resin, when uncured, having a viscosity of from 0.005 pascal·seconds to 0.02 pascal·seconds.

EMBODIMENT 25 can include, or can optionally be combined with the subject matter of one or any combination of EMBODIMENTS 1-24, to optionally include the first filler particles comprising at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

EMBODIMENT 26 can include, or can optionally be combined with the subject matter of one or any combination of EMBODIMENTS 1-25, to optionally include the second filler particles comprising at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

EMBODIMENT 27 can include, or can optionally be combined with the subject matter of one or any combination of EMBODIMENTS 1-26, to optionally include the coefficient of thermal expansion of the first filler particles being less than or equal to 15 ppm/° C.

EMBODIMENT 28 can include, or can optionally be combined with the subject matter of one or any combination of EMBODIMENTS 1-27, to optionally include the coefficient of thermal expansion of the second filler particles being less than or equal to 15 ppm/° C.

EMBODIMENT 29 can include, or can optionally be combined with the subject matter of one or any combination of EMBODIMENTS 1-28, to optionally include the plurality of filler particles further comprise third filler particles having a particle size that is less than the particle size of the second filler particles.

EMBODIMENT 30 can include, or can optionally be combined with the subject matter of one or any combination of EMBODIMENTS 1-29, to optionally include the third filler particles comprising at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

EMBODIMENT 31 can include, or can optionally be combined with the subject matter of one or any combination of EMBODIMENTS 1-30, to optionally include the coefficient of thermal expansion of the third filler particles being less than or equal to 15 ppm/° C.

EMBODIMENT 32 can include, or can optionally be combined with the subject matter of one or any combination of EMBODIMENTS 1-31, to optionally include the total loading of the plurality of filler particles being from 40 weight % to 75 weight % of the underfill composition.

EMBODIMENT 33 can include, or can optionally be combined with the subject matter of one or any combination of EMBODIMENTS 1-32, to optionally include the first filler particles having an average size of from 0.1 micrometers to 3 micrometers.

EMBODIMENT 34 can include, or can optionally be combined with the subject matter of one or any combination of EMBODIMENTS 1-33, to optionally include a loading of the second filler particles being below or proximate to a cutoff threshold where the viscosity of the underfill composition begins to increase.

EMBODIMENT 35 can include, or can optionally be combined with the subject matter of one or any combination of EMBODIMENTS 1-34, to include subject matter (such as an apparatus, a device, a method, or one or more means for performing acts), such as can include a method of mounting a semiconductor flip chip to a substrate comprising providing or receiving a semiconductor chip, mounting the semiconductor chip to a substrate with a plurality of solder joints, and filling a space between the semiconductor chip and the substrate and around the plurality of solder joints with an underfill composition, wherein the underfill composition comprises a resin having a viscosity of from about 0.005 pascal·seconds to 0.01 pascal·seconds, and a plurality of filler particles loaded within the resin, the filler particles comprising at least about 50 weight % of the underfill composition, the filler particles comprising first filler particles having a particle size of from about 0.1 micrometers to about 15 micrometers and second filler particles having a particle size of less than 100 nanometers, wherein a viscosity of the underfill composition is less than a viscosity of a corresponding composition not including the second filler particles.

EMBODIMENT 36 can include, or can optionally be combined with the subject matter of one or any combination of EMBODIMENTS 1-35, to optionally include curing the resin or allowing the resin to cure.

EMBODIMENT 37 can include, or can optionally be combined with the subject matter of one or any combination of EMBODIMENTS 1-36, to optionally include the second filler particles having an average particle size of about 50 nanometers.

EMBODIMENT 38 can include, or can optionally be combined with the subject matter of one or any combination of EMBODIMENTS 1-37, to optionally include a weight percentage loading of the second filler particles being less or equal to about 15 weight % of the underfill composition.

EMBODIMENT 39 can include, or can optionally be combined with the subject matter of one or any combination of EMBODIMENTS 1-38, to optionally include the underfill composition having a viscosity of less than 0.8 pascal·seconds.

EMBODIMENT 40 can include, or can optionally be combined with the subject matter of one or any combination of EMBODIMENTS 1-39, to optionally include the underfill composition having a viscosity of less than or equal to 0.5 pascal·seconds.

EMBODIMENT 41 can include, or can optionally be combined with the subject matter of one or any combination of EMBODIMENTS 1-40, to optionally include the resin comprising a curable epoxy resin.

EMBODIMENT 42 can include, or can optionally be combined with the subject matter of one or any combination of EMBODIMENTS 1-41, to optionally include the resin, when uncured, having a viscosity of from 0.005 pascal·seconds to 0.02 pascal·seconds.

EMBODIMENT 43 can include, or can optionally be combined with the subject matter of one or any combination of EMBODIMENTS 1-42, to optionally include the first filler particles comprising at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

EMBODIMENT 44 can include, or can optionally be combined with the subject matter of one or any combination of EMBODIMENTS 1-43, to optionally include the second filler particles comprising at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

EMBODIMENT 45 can include, or can optionally be combined with the subject matter of one or any combination of EMBODIMENTS 1-44, to optionally include the coefficient of thermal expansion of the first filler particles being less than or equal to 15 ppm/° C.

EMBODIMENT 46 can include, or can optionally be combined with the subject matter of one or any combination of EMBODIMENTS 1-45, to optionally include the coefficient of thermal expansion of the second filler particles being less than or equal to 15 ppm/° C.

EMBODIMENT 47 can include, or can optionally be combined with the subject matter of one or any combination of EMBODIMENTS 1-46, to optionally include the plurality of filler particles further comprising third filler particles having a particle size that is less than the particle size of the second filler particles.

EMBODIMENT 48 can include, or can optionally be combined with the subject matter of one or any combination of EMBODIMENTS 1-47, to optionally include the third filler particles comprising at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

EMBODIMENT 49 can include, or can optionally be combined with the subject matter of one or any combination of EMBODIMENTS 1-48, to optionally include the coefficient of thermal expansion of the third filler particles being less than or equal to 15 ppm/° C.

EMBODIMENT 50 can include, or can optionally be combined with the subject matter of one or any combination of EMBODIMENTS 1-49, to optionally include the total loading of the plurality of filler particles is from 40 weight % to 75 weight % of the underfill composition.

EMBODIMENT 51 can include, or can optionally be combined with the subject matter of one or any combination of EMBODIMENTS 1-50, to optionally include the first filler particles having an average size of from 0.1 micrometers to 3 micrometers.

EMBODIMENT 52 can include, or can optionally be combined with the subject matter of one or any combination of EMBODIMENTS 1-51, to optionally include a loading of the second filler particles being below or proximate to a cutoff threshold where the viscosity of the underfill composition begins to increase.

These and other examples and features of the present electronic device, solder compositions, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

The above detailed description includes references to the accompanying drawings, which form a part of the detailed description. The drawings show, by way of illustration, specific embodiments in which the invention can be practiced. These embodiments are also referred to herein as "examples" or "embodiments." Such examples or embodiments can include elements in addition to those shown or described. However, the present inventors also contemplate examples or embodiments in which only those elements shown or described are provided. Moreover, the present inventors also contemplate examples or embodiments using any combination or permutation of those elements shown or described (or one or more aspects thereof), either with respect to a particular example or embodiment (or one or more aspects thereof), or with respect to other examples or embodiments (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An underfill composition comprising:
   a curable resin;
   a plurality of filler particles loaded within the resin, the filler particles comprising at least 50 weight % of the underfill composition, the filler particles comprising:
      first filler particles having a particle size of from 0.1 micrometers to 15 micrometers; and
      second filler particles having a particle size of less than 100 nanometers, wherein a loading of the second filler particles in the underfill composition is below or proximate to a cutoff threshold where the viscosity of the underfill composition begins to increase;
   wherein a viscosity of the underfill composition is less than a viscosity of a corresponding composition not including the second filler particles.

2. The underfill composition of claim 1, wherein the second filler particles have an average particle size of about 50 nanometers.

3. The underfill composition of claim 2, wherein a weight percentage loading of the second filler particles is up to about 15 weight % of the underfill composition.

4. The underfill composition of claim 2, further comprising third filler particles having an average particle size of about 10 nanometers.

5. The underfill composition of claim 1, wherein the underfill composition has a viscosity of less than 0.8 pascal·seconds.

6. The underfill composition of claim 1, wherein the resin comprises a curable epoxy resin.

7. The underfill composition of claim 1, wherein the resin, when uncured, has a viscosity of from 0.005 pascal·seconds to 0.02 pascal·seconds.

8. The underfill composition of claim 1, wherein the first filler particles and the second filler particles comprise at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

9. The underfill composition of claim 1, wherein the coefficient of thermal expansion of the first filler particles and the second filler particles is less than or equal to 15 ppm/° C.

10. The underfill composition of claim 1, wherein the total loading of the plurality of filler particles is from 40 weight % to 75 weight % of the underfill composition.

11. The underfill composition of claim 1, wherein the first filler particles have an average size of from 0.1 micrometers to 3 micrometers.

12. A semiconductor package comprising:
    a semiconductor chip;

a substrate comprising a plurality of metalized contact pads;

a plurality of solder joints bonding the semiconductor chip to the plurality of metalized contact pads; and an underfill composition filling a space between the semiconductor chip and the substrate and around the plurality of solder joints, the underfill composition comprising:

a resin; and a plurality of filler particles loaded within the resin, the filler particles comprising at least 50 weight % of the underfill composition, the filler particles comprising:

first filler particles having a particle size of from 0.1 micrometers to 15 micrometers; and second filler particles having a particle size of less than 100 nanometers, wherein a loading of the second filler particles in the underfill composition is below or proximate to a cutoff threshold where the viscosity of the underfill composition begins to increase; and wherein a viscosity of the underfill composition is less than a viscosity of a corresponding composition not including the second filler particles.

13. The semiconductor package of claim 12, wherein the second filler particles have an average particle size of about 50 nanometers.

14. The semiconductor package of claim 13, wherein a weight percentage loading of the second filler particles is up to about 15 weight % of the underfill composition.

15. The semiconductor package of claim 13, further comprising third filler particles having an average particle of about 10 nanometers.

16. The semiconductor package of claim 12, wherein the first filler particles and the second filler particles comprise at least one of silica ($SiO_2$), alumina ($Al_2O_3$), titanium dioxide ($TiO_2$), boron trioxide ($B_2O_3$), aluminum nitride (AlN), boron nitride (BN), graphite, diamond dust, clay, and silicon carbide (SiC).

17. A method of mounting a semiconductor flip chip to a substrate, the method comprising:

providing or receiving a semiconductor chip;

mounting the semiconductor chip to a substrate with a plurality of solder joints; and filling a space between the semiconductor chip and the substrate and around the plurality of solder joints with an underfill composition, the underfill composition comprising;

a resin having a viscosity of from about 0.005 pascal·seconds to 0.01 pascal·seconds; and a plurality of filler particles loaded within the resin, the filler particles comprising at least about 50 weight % of the underfill composition, the filler particles comprising:

first filler particles having a particle size of from about 0.1 micrometers to about 15 micrometers; and second filler particles having a particle size of less than 100 nanometers, wherein a loading of the second filler particles in the underfill composition is below or proximate to a cutoff threshold where the viscosity of the underfill composition begins to increase; and wherein a viscosity of the underfill composition is less than a viscosity of a corresponding composition not including the second filler particles.

18. The method of claim 17, further comprising curing the resin or allowing the resin to cure.

19. The method of claim 17, wherein the underfill composition has a viscosity of less than or equal to 0.5 pascal·seconds.

20. The method of claim 17, wherein a weight percentage loading of the second filler particles is up to about 15 weight % of the underfill composition.

* * * * *